United States Patent [19]

Tsutsumi et al.

[11] Patent Number: 5,183,533
[45] Date of Patent: * Feb. 2, 1993

[54] METHOD FOR ETCHING CHROMIUM FILM FORMED ON SUBSTRATE

[75] Inventors: Michinari Tsutsumi; Atsushi Endo; Toshio Yada, all of Hyogo, Japan

[73] Assignee: Mitsubishi Denki Kabushiki Kaisha, Tokyo, Japan

[*] Notice: The portion of the term of this patent subsequent to Apr. 16, 2008 has been disclaimed.

[21] Appl. No.: 599,782

[22] Filed: Oct. 17, 1990

Related U.S. Application Data

[63] Continuation of Ser. No. 249,905, Sep. 27, 1988, Pat. No. 5,007,984.

[30] Foreign Application Priority Data

Sep. 28, 1987 [JP] Japan ................... 62-245035
Oct. 7, 1987 [JP] Japan ................... 62-253423

[51] Int. Cl.$^5$ ............................................. C23F 1/00
[52] U.S. Cl. ................... 156/656; 156/659.1; 156/664; 252/79.2
[58] Field of Search .............. 156/656, 664, 659.1; 252/79.2, 79.1

[56] References Cited

U.S. PATENT DOCUMENTS 4,725,375 2/1988 Fujii et al. ..................... 156/664
5,007,984 4/1991 Tsutsumi et al. ............. 156/665 X

OTHER PUBLICATIONS

Janus, "Chemical Etch Rate Studies on Sputtered Chromium Films", J. Electrochem. Soc., vol. 119, No. 3, Mar. 1972, pp. 392–396.

*Primary Examiner*—Thi Dang
*Attorney, Agent, or Firm*—Lowe, Price, LeBlanc & Becker

[57] ABSTRACT

A method for etching a chromium film includes the steps of forming a resist having a phenol novolak resin as a principal chain on the chromium film formed on a substrate, and etching the chromium film using an etchant while stripping off the resist from the chromium film using an etchant containing nitric acid. A second method for etching a chromium film includes the steps of forming an aluminum film or an aluminum alloy film on the chromium film formed on a substrate, forming a resist having a predetermined pattern on the aluminum film or the aluminum alloy film, etching the aluminum film or the aluminum alloy film and the chromium film using phosphoric acid, and removing by etching the aluminum film or the aluminum alloy film using phosphoric acid containing nitric acid after removing the resist.

3 Claims, 4 Drawing Sheets

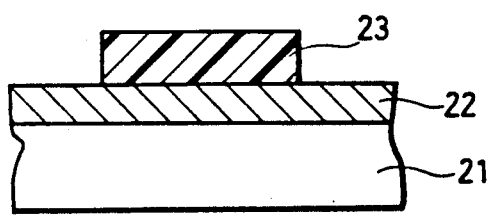
FIG.3A
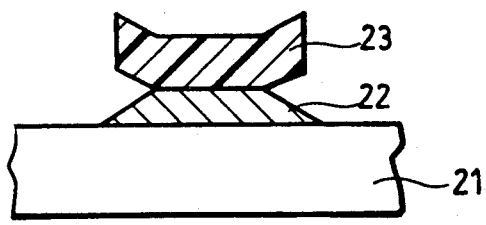
FIG.3B
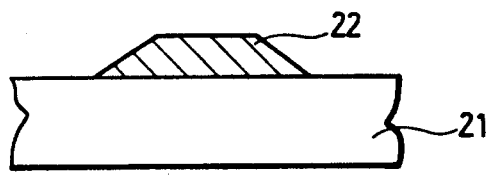
FIG.3C
FIG.4
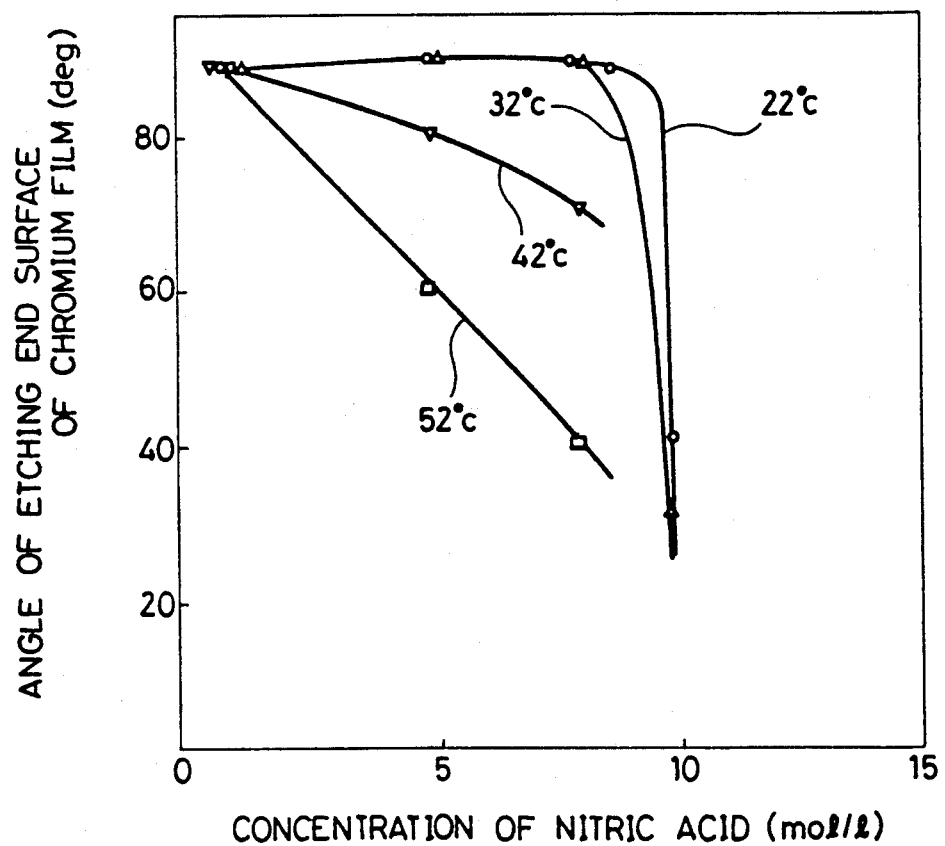

METHOD FOR ETCHING CHROMIUM FILM FORMED ON SUBSTRATE

This application is a continuation of application Ser. No. 07/249,905 filed Sep. 27, 1988, now U.S. Pat. No. 5,007,984.

BACKGROUND OF THE INVENTION

1. Field of the Invention

The present invention relates generally to a method for etching a chromium film formed on a substrate, and more particularly, to a method for etching a chromium film suitable for a multilayer interconnection body in which a film is further formed on the chromium film.

2. Description of the Prior Art

FIGS. 1A, 1B, and 1C are cross sectional views for explaining an example of a conventional method for etching a chromium film. FIG. 1A shows a state before etching a chromium film. In FIG. 1A, a chromium film 2 is formed on a substrate 1, and a resist pattern 3 is formed on the chromium film 2. The resist pattern 3 can be formed using a photolithographic technique ordinarily used. The chromium film 2 is then dipped in an etchant having the composition of 17 g of ammonium cerium (IV) nitrate, 5 cc of perchloric acid and 100 cc of water. This etchant is a chromium etchant used in patterning a chromium film, which is described, for example, by Naraoka and Nihei in the "Photo-Etching and Fine Structure Processing", Sogodenshi Shuppansha, issued May 10, 1977. The chromium film 2 is oxidized in the etchant, to be ions. The ions dissolve in the etchant. At this time, a portion coated with the resist pattern 3 does not come into contact with the etchant, so that the chromium film under the resist pattern 3 does not dissolve. Thus, the chromium film 2 in a portion where the resist pattern 3 is not provided dissolves, as shown in FIG. 1B. Then, as shown in FIG. 1C, the resist pattern 3 is removed by plasma ashing, so that a pattern of the chromium film 2 is obtained.

An etching end surface of the chromium film obtained by such a conventional method is approximately vertical, as shown in FIG. 1C. Therefore, when a film is further formed on this chromium film, the height of a portion corresponding to an underlayer rapidly changes, so that crystalline characteristics of the film in this portion are liable to change. Consequently, defects occur in a film formed on the chromium film, whereby the reliability is decreased.

In order to solve such a problem, Japanese Patent Laying-Open Gazette No. 111366/1983 discloses a method for etching a metal film formed on a substrate in a tapered shape. FIGS. 2A, 2B and 2C are cross sectional views for explaining the method disclosed in this gazette. FIG. 2A shows a state in which a resist is formed on a chromium film 12 duly formed on a substrate 11 and the resist is removed after the first etching. FIG. 2B shows a state in which a resist 14 is formed on the chromium film 12 shown in FIG. 2A so as to be of a pattern narrower than the pattern of the chromium film 12. The chromium film 12 is then etched while being in contact with a chromium etchant in this state. On this occasion, the chromium film 12 is not completely etched but the etching thereof is terminated in the halfway stage. Consequently, a cross section of the chromium film 12 can be made to have a gentle shape as shown in FIG. 2C. Therefore, the change in crystalline characteristics of the film formed on the chromium film can be made small, so that occurrence of defects can be suppressed and the reliability can be increased.

However, in this conventional method, the process for forming the resist pattern is required two or more times, so that the manufacturing process becomes complicated and the manufacturing cost becomes high.

Additionally, in this method, the second or the subsequent etching must be terminated halfway. Therefore, it is necessary to determine the time point when etching is terminated. However, it is difficult to determine the time point when etching is terminated, so that it is difficult to control a tapered shape of an etching end surface.

SUMMARY OF THE INVENTION

An object of the present invention is to provide a method for etching a chromium film by which a side surface of the chromium film can be tapered in a simple process.

Another object of the present invention is to provide a method by which a chromium film can be etched such that a side surface thereof makes an angle with a predetermined slope.

Another object of the present invention is to provide a method by which a chromium film can be etched in a desired shape in a reproducible manner by controlling the shape of a side surface of the chromium film.

The inventors of the present invention have found that a coating film is formed on a chromium film and the chromium film is etched while decreasing the contact area of the coating film with the chromium film, so that an etching end surface, i.e., a side surface of the chromium film can be formed in a tapered shape.

More specifically, an etching method according to the present invention comprises the steps of forming a coating film on a chromium film formed on a substrate, and etching the chromium film using an etchant while decreasing the contact area of the chromium film with the coating film. According to the present invention, during etching, the contact area of the chromium film with the coating film is decreased as the etching progresses. Therefore, the closer the position of the chromium film comes to the coating film, the larger the degree of etching of the chromium film becomes. As a result, the etching end surface is inclined, to have a tapered shape.

In accordance with a preferred aspect of the present invention, the etching method comprises the steps of forming a resist having a predetermined pattern on the chromium film formed on the substrate, and etching the chromium film using an etchant while stripping off the resist from the chromium film. In this aspect, as the etching progresses, the resist is stripped off from the chromium film, so that the contact area of the chromium film with the coating film, i.e., the resist is reduced. Such stripping of the resist from the chromium film may be achieved by physically stripping off the resist from the chromium film or stripping off the resist from the chromium film by chemical means. In a preferred manner of this aspect, the resist is stripped off from the chromium film using the etchant. Such stripping can be achieved by selecting an etchant which corrodes the resist in the interface of the resist and the chromium film. If and when a resist having a phenol novolak resin as a principal chain is used, which resist is generally used, the resist can be stripped off by using an etchant including nitric acid. In the case of the resist generally used, the chromium film is etched while stripping off the resist from the chromium film using an etchant containing 2 or more mol/liter or nitric acid, so that an etching end surface of the chromium film can be tapered. As will be described in the following embodiment, the concentration of nitric acid in the etchant can be suitably selected depending on the type of the resist and the temperature of the etchant. An angle of the tapered shape of the etching end surface of the chromium film can be controlled by means of the temperature of the etchant, the concentration of nitric acid in the etchant, or the like.

In accordance with another preferred aspect of the present invention, the etching method comprises the steps of forming a metal film on a chromium film formed on a substrate, forming a resist having a predetermined pattern on the metal film, etching the metal film and the chromium film using such a first etchant with which both the chromium film and the metal film are etched, and the etching rate to the metal film is higher than the etching rate to the chromium film, and removing the metal film using a second etchant after removal of the resist. In this aspect, the metal film is formed on the chromium film and then, the metal film and the chromium are etched using such a first etchant that both the chromium film and the metal film are etched, and the etching rate to the metal film is higher than the etching rate to the chromium film. Therefore, during etching using the first etchant, the metal film is etched faster than the chromium film. As a result, etching is performed while decreasing the contact area of the chromium film with the metal film. Therefore, the degree of etching of the chromium film is larger as the position of the chromium film comes closer to the metal film, so that the etching end surface of the chromium film is inclined, to have a tapered shape.

In a preferred manner of this aspect, an aluminum film or an aluminum alloy film is selected as a metal film. When the aluminum film or the aluminum alloy film is used as the metal film, phosphoric acid can be used as a first etchant. If the phosphoric acid is used, both the chromium film and the aluminum film are etched, and the etching rate to the aluminum film or the aluminum alloy film becomes higher than the etching rate to the chromium film. In addition, if phosphoric acid is used as the first etchant, a residue of the chromium film remains on the substrate after etching. The residue of the chromium film can be removed by etching using a chromium etchant which is a third etchant.

According to the etching method of the present invention, a side surface of the chromium film can be tapered in a simple process, so that the manufacturing cost can be reduced, as compared with the conventional method. Furthermore, the chromium film can be etched such that the side surface thereof has a desired angle by selecting the temperature, the concentration and the type of the etchant, so that etching can be performed with a high precision. Thus, etching can be performed in reproducible manner.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 3A is a cross sectional view showing a state in which a resist pattern is formed on a chromium film in one embodiment of the present invention;

FIG. 3B is a cross sectional view showing a state in which the chromium film is etched while stripping off the resist pattern from the chromium film according to one embodiment of the present invention;

FIG. 3C is a cross sectional view showing a state after removal of the resist pattern in one embodiment of the present invention;

FIG. 4 is a diagram showing the relation between the concentration of nitric acid in an etchant and an angle of an etching end surface of the chromium film;

DESCRIPTION OF THE PREFERRED EMBODIMENTS

Figure 1A:
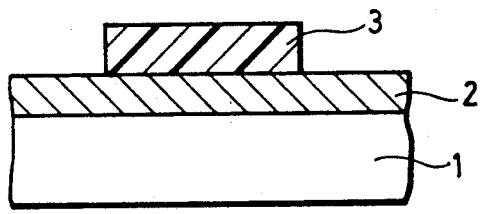
FIG. 1A is a cross sectional view showing a state before etching of a chromium film according to one example of a conventional method.
Figure 1B:
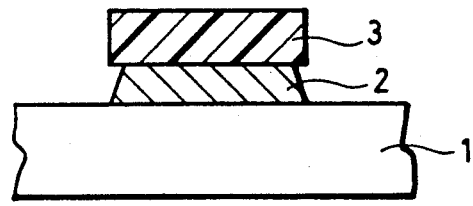
FIG. 1B is a cross sectional view showing a state after etching of the chromium film according to one example of the conventional method.
Figure 1C:
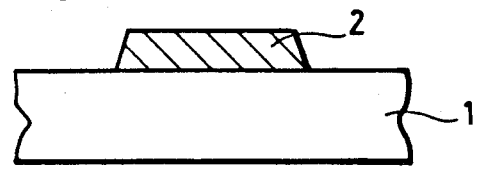
FIG. 1C is a cross sectional view showing a state after removal of a resist according to one example of the conventional method.
Figure 2A:
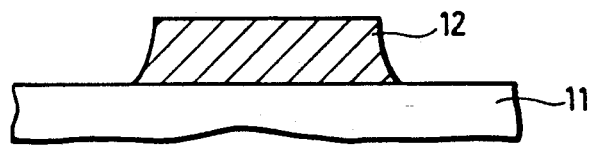
FIG. 2A is a cross sectional view showing a state in which a resist is removed after first etching of a chromium film according to another example of the conventional method.
Figure 2B:
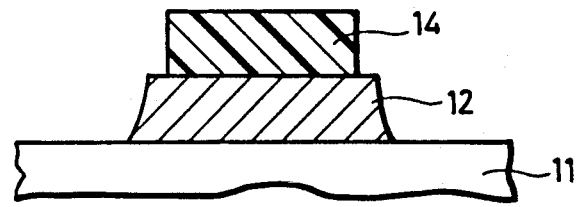
FIG. 2B is a cross sectional view showing a state in which the resist is formed on the chromium film after the first etching according to another example of the conventional method.
Figure 2C:
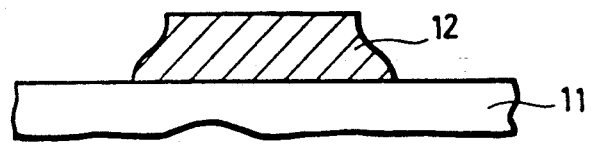
FIG. 2C is a cross sectional view showing a state in which second etching of the chromium film is performed to remove the resist according to another example of the conventional method.

FIGS. 3A, 3B and 3C are cross sectional views for explaining a first embodiment of the present invention. FIG. 3A shows a state in which a resist pattern is formed on a chromium film in the first embodiment of the present invention. In FIG. 3A, a chromium film 22 having a thickness of 500 to 5000 Å is formed on a silicon substrate 21 by, for example, a plating process. A resist pattern 23 having a thickness of 0.5 to 3 μm is formed on the chromium film 22 using, for example, a conventional photolithographic technique. A photoresist OFPR-77E (manufactured by TOKYO OHKA KOGYO CO., LTD.) which is a resist film having a phenol novolak resin as a principal chain is employed as the resist.

The substrate 21 is then dipped in an etchant at a temperature of 45° C. having the composition of 17 g of ammonium cerium (IV) nitrate, 13 cc of nitric acid and 87 cc of water. At this time, the resist pattern 23 starts to be stripped off from an end thereof by nitric acid in the etchant, as shown in FIG. 3B. In addition, the chromium film 22 is oxidized by an oxidizing agent in the etchant, to dissolve in the etchant as ions, so that etching proceeds. Since this etching and stripping of the resist pattern 23 proceed simultaneously, the etching end surface of the chromium film 22 is tapered, as shown in FIG. 3B.

Finally, the resist pattern 23 is removed, as shown in FIG. 3C.

FIG. 4 is a diagram showing an example of the relation between the concentration of nitric acid in the etchant and an angle of the etching end surface of the chromium film. As shown in FIG. 4, the higher the concentration of nitric acid in the etchant is, the smaller an angle of the etching end surface of the chromium film becomes. In addition, the higher the temperature of the etchant is, the smaller the angle of the etching end surface of the chromium film becomes. Thus, the higher the temperature of the etchant is, the lower the concentration of nitric acid can be. Furthermore, the angle of the etching end surface of the chromium film can be controlled by changing the temperature of the etchant and the concentration of nitric acid in the etchant.

Although in the above described first embodiment, a silicon substrate was used as a substrate, a substrate of another material can be used. Although in the above described first embodiment, the chromium film was formed using a plating technique, the chromium film may be formed using a dry film forming technique such as a vacuum evaporation process. Although in the above described first embodiment, the photoresist OFPR-77E was used as a resist, another macromolecule having a phenol novolak resin as a principal chain may be used. In addition, another resin can be also used as the resist, which can be stripped off from the chromium film using an etchant during etching.

Although in the above described first embodiment, a photolithographic technique is used as a method for forming the resist in a predetermined pattern, another technique such as a printing technique may be used. In addition, an etchant of any other composition may be used, which can strip off the resist from the chromium film during etching. Although in the above described first embodiment, a dipping technique is used as a method for etching the chromium film, another technique such as a showering technique may be used.

Figure 5A:
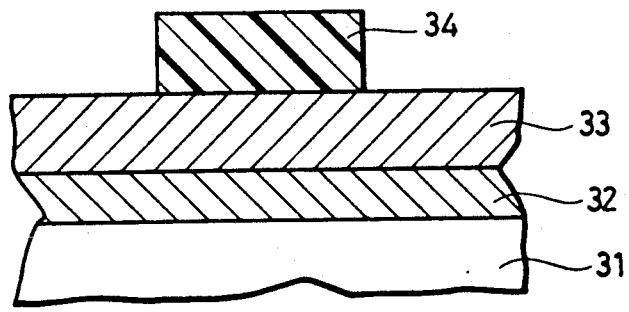
FIG. 5A is a cross sectional view showing a state in which a metal film is formed on a chromium film and a resist is formed thereon in another embodiment of the present invention.

FIGS. 5A, 5B, 5C and 5D are cross sectional views for explaining a second embodiment of the present invention. In FIG. 5A, a chromium film 32 having a thickness of 500 to 2000 Å is formed on a silicon substrate 31 by, for example, a vacuum evaporation process. An aluminum film 33 having a thickness of 1000 to 20000 Å is formed on the chromium film 32 by, for example, the vacuum evaporation process. A resist pattern 34 formed by, for example, a photoresist OFPR-800 (manufactured by TOKYO OHKA KOGYO CO., LTD.) is formed on the aluminum film 33.

Figure 5B:
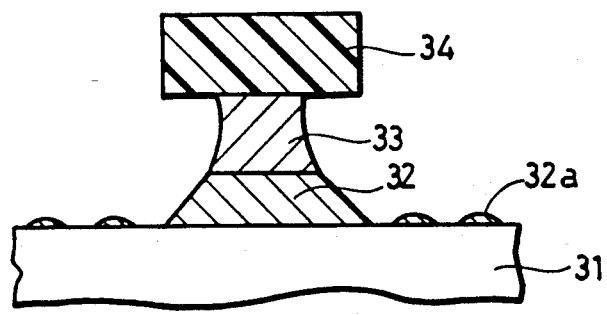
FIG. 5B is a cross sectional view showing a state in which the chromium film and the metal film are etched using a first etchant in another embodiment of the present invention.
Figure 6:
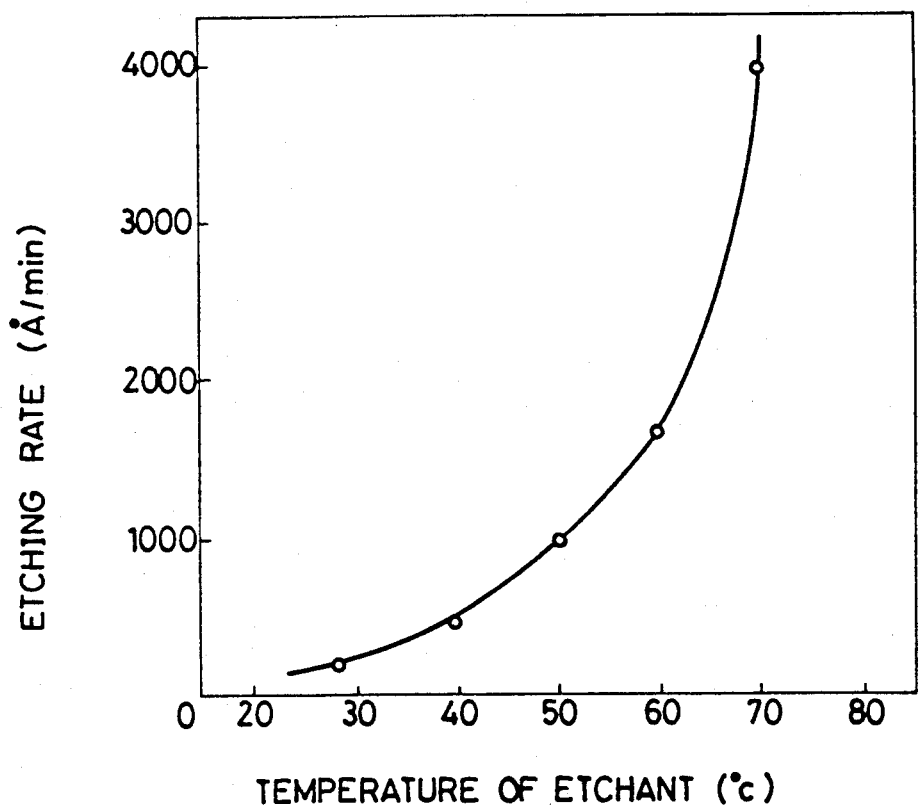
FIG. 6 is a diagram showing the relation between the etching rate in the case in which concentrated phosphoric acid is used as a first etchant and the temperature of the etchant in another embodiment of the present invention.

The aluminum film 33 and the chromium film 32 are then etched using phosphoric acid, for example, concentrated phosphoric acid at 45° C. Since both the chromium film and the aluminum film are etched, and the etching rate to the chromium film 32 is lower than the etching rate to the aluminum film 33, an etching end surface of the chromium film 32 is tapered, as shown in FIG. 5B. FIG. 6 is a diagram showing the relation between the etching rate to a two-layer film and the temperature of an etchant.

Figure 5C:
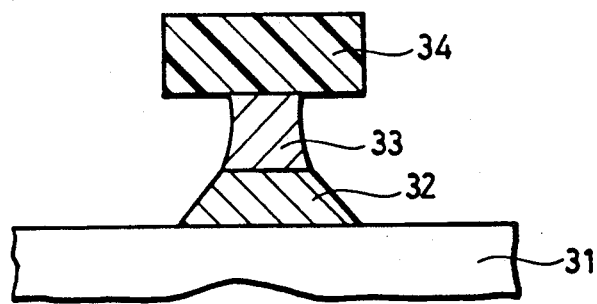
FIG. 5C is a cross sectional view showing a state in which a residue of the chromium film is removed using a third etchant in another embodiment of the present invention.
Figure 5D:
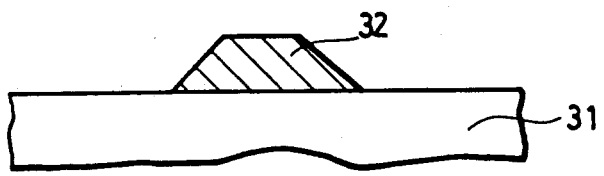
FIG. 5D is a cross sectional view showing a state in which the metal film is removed using a second etchant in another embodiment of the present invention.

In such etching using phosphoric acid, a residue 32a of the chromium film remains on the substrate 31. The residue 32a of the chromium film can be removed using a chromium etchant, for example, $HClO_4/(NH_4)_2Ce(NO_3)_6/H_2O$. FIGS. 5C shows a state after removing the residue 32a of the chromium film. The resist pattern 34 is then removed by, for example, plasma ashing. The aluminum film 33 is then removed using a solution of phosphoric acid containing nitric acid, such as a solution at 45° C. having a volume ratio of phosphoric acid:nitric acid = 20:1, which state is shown in FIG. 5D. In the above described manner, the chromium film 32 can be etched such that the etching end surface thereof is tapered.

Although in the above described second embodiment, the silicon substrate is used as a substrate, a substrate of material such as a glass substrate or the like can be used. Although in the above described second embodiment, the chromium film is formed by a vacuum evaporation process, the chromium film may be formed by a film forming process such as a sputtering process and a plating process. Although in the above described second embodiment, the aluminum film is used as a metal film, an aluminum alloy film may be used. In addition, the aluminum film and the aluminum alloy film may be formed by not only the vacuum evaporation process but also a film forming process such as the sputtering process. Although in the second embodiment, the photoresist OFPR-800 is used as a resist, another resist can be used. Although in the second embodiment $HCl_4O_4/(NH_4)_2Ce(No_3)_6/H_2O$ is used to remove a residue of the chromium film, another chromium etchant may be used. Furthermore, although the resist is removed by plasma ashing, another resist removing process may be employed. Although concentrated phosphoric acid at 45° C. is used as a first etchant, another etchant can be used in which both the chromium film and the aluminum film are etched, and the etching rate to the aluminum film which is a metal film is higher than the etching rate to the chromium film.

An angle of a tapered shape formed on the etching end surface of the chromium film can be controlled to a desired angle by suitably selecting the material of the metal film and the type, the temperature or the like of the first etchant.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for etching a chromium film formed on a substrate, comprising the steps of:
   (a) providing a chromium film formed on a substrate,
   (b) forming a coating film having a predetermined pattern on the chromium film, to selectively expose the chromium film, and
   (c) etching the exposed chromium film with an etchant comprising at least 2 mol/l of nitric acid, the concentration of nitric acid in the etchant and the temperature of the etchant being sufficient to cause a decrease in the contact area of the chromium film with the coating film, whereby sidewall surfaces of a remaining pattern of the etched chromium film are tapered.

2. The method according to claim 1, wherein the coating film comprises a resist and the concentration of nitric acid in the etchant and the temperature of the etchant are sufficient to strip a portion of the resist from the chromium film while etching the chromium film.

3. The method according to claim 2, wherein the resist comprises a phenol novolak resin as a principal chain.

* * * * *